United States Patent [19]
Joly et al.

[11] Patent Number: 5,644,498
[45] Date of Patent: Jul. 1, 1997

[54] TIMING SHELL GENERATION THROUGH NETLIST REDUCTION

[75] Inventors: Christian Joly, Palo Alto; Francois Ducaroir, San Francisco; Zarir Sarkari; Allen Wu, both of San Jose, all of Calif.

[73] Assignee: LSI Logic Corporation, Milpitas, Calif.

[21] Appl. No.: 377,844

[22] Filed: Jan. 25, 1995

[51] Int. Cl.$^6$ .................................................... G06F 15/00
[52] U.S. Cl. ................... 364/489; 364/488; 364/490; 364/491
[58] Field of Search .................. 364/489, 488, 364/490, 491, 578, 580; 395/500, 550, 160, 157, 600, 800, 700, 920; 371/22.2, 25.1, 22.3, 22.1; 257/206, 210, 909; 361/792, 803

[56] References Cited

U.S. PATENT DOCUMENTS

| | | | |
|---|---|---|---|
| 4,744,084 | 5/1988 | Beck et al. | 364/578 |
| 4,942,536 | 7/1990 | Watanabe et al. | 364/490 |
| 5,095,454 | 3/1992 | Huang | 364/578 |
| 5,191,541 | 3/1993 | Landman et al. | 364/488 |
| 5,197,015 | 3/1993 | Hartoog et al. | 364/488 |
| 5,237,514 | 8/1993 | Curtin | 364/490 |
| 5,301,318 | 4/1994 | Mittal | 364/578 |
| 5,309,371 | 5/1994 | Shikata et al. | 364/490 |
| 5,396,435 | 3/1995 | Ginetti | 364/489 |
| 5,402,357 | 3/1995 | Schaefer et al. | 364/490 |
| 5,426,591 | 6/1995 | Ginetti et al. | 364/489 |
| 5,461,576 | 10/1995 | Tsay et al. | 364/490 |
| 5,475,605 | 12/1995 | Lin | 364/488 |
| 5,477,474 | 12/1995 | Southgate et al. | 364/489 |

Primary Examiner—Kevin J. Teska
Assistant Examiner—Jacques Louis-Jacques
Attorney, Agent, or Firm—Calvin B. Ward

[57] ABSTRACT

Gate level netlists used for timing analysis in integrated circuit design are reduced using a timing shell generator while preserving critical information for timing analysis. After verification of timings, the gate level netlist is convened into a shell containing block boundary information. The function of the shell generator is to delete internal cells meeting a set of criteria. The result is a shell netlist containing a subset of the original netlist. Thus, the design cycle time involved and computing time and resources needed in ASIC development for chips using circuits represented by timing shell netlists are decreased by substituting design verification at the top level of large hierarchical netlists or large flat netlists by bottom up verification procedures using timing shells.

12 Claims, 8 Drawing Sheets

TIMING SHELL GENERATION THROUGH NETLIST REDUCTION

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The present invention relates to design tools used in development of application specific integrated circuit (ASIC) technology; and more particularly to techniques involved in performing timing analysis on circuit designs used in ASICs.

2. Description of Related Art

The development of ASICs is based on designs including basic circuit cells selected from a library which spans the spectrum from simple glue logic elements to more complex logic blocks to complex system level core circuits. One part of the design and production methodology used for this kind of development involves timing validation for the designed system. Timing validation for the system is a complex technical issue when the number of basic building blocks on an integrated circuit becomes large. With current designs commonly involving more than a million usable gates, the timing validation of such systems can utilize significant amounts of processor time and memory, and require complex computer systems.

Development and verification tools used in ASIC design usually implement a hardware description language such as VERILOG or VHDL.

These tools are provided by major electronic design automation vendors. Such design tools provide the functions necessary to take a design specified in the hardware description language from a design at the netlist level to working silicon. The functions include timing analysis tools, floor planning tools, layout tools, packaging tools, and more.

In the ASIC industry, timing analysis has been done based on data structures known as netlists. There are a number of industry standard formats for such netlists including the Netlist Description Format (NDL), the Electronic Data Interchange Format (EDIF), and VERILOG format. The netlist comprises a list of basic cells used in the design of the system, specifying interconnection among the cells. Connections between or among cells are known as nets. A circuit path through a system comprises a number of cells and the interconnecting nets for the circuit path.

In the prior art, a full timing gate level simulation is executed based on an entire netlist. This can be quite time consuming as mentioned above. Also, it requires that the designer of any particular circuit unit being incorporated into a larger system level integration make the netlist available for use by people designing with the circuit unit. This is undesirable because it can amount to a publication of information which would otherwise be maintained as a company trade secret.

Accordingly, in order to make timing analysis more efficient, and to protect the investment of circuit developers in the ASIC field, it is desirable to provide an alternative to the full netlist description of certain circuit blocks, which can nonetheless be used by customers for timing analysis.

SUMMARY OF THE INVENTION

The present invention operates to decrease the design cycle time involved in ASIC development by substituting design verification at the top level of large hierarchical netlists or of flat netlists by bottom up verification 4 procedures using timing shells. The timing shell provides boundary timing and constraint information for a circuit block at the upper level of the hierarchy to support timing analysis at that level. Use of the timing shell reduces run time and memory requirements during static timing verification of a design that includes the circuit block represented by the timing shell. It also provides transportability and re-usability for circuit designs and hierarchical design blocks represented by the timing shells. Further, it provides a vehicle for enabling a customer to perform static timing verification with reduced netlist information, protecting intellectual property of the creator of the circuit represented by the timing shell.

Thus, the present invention can be characterized as an apparatus for reducing a netlist which comprises a memory in which the netlist is stored, and processing resources coupled with the memory which execute an algorithm to reduce the netlist to a timing shell netlist by removing internal cells which meet a set of criteria. The timing shell netlist preserves information from the circuit netlist used in timing analysis of the system incorporating the circuit. These processing resources recursively examine cells in the netlist along circuit paths connected to nets at each input and output of the circuit. The set of criteria used for reducing the netlist includes, for example, the following:

1) for a particular circuit path connected to a net at an input of the circuit, preserve combinatorial cells between the input and a first storage element on the particular circuit path and preserve combinatorial cells coupled to a combinatorial path between the particular circuit path and a circuit boundary without an intervening storage cell;

2) for a particular circuit path coupled to an input and an output of the circuit, preserve combinatorial cells on the particular circuit path which establish a combinatorial path between the input and the output;

3) for a particular net coupled by a first combinatorial circuit path from an output of a first storage cell in the circuit to a circuit boundary, in which the first storage cell is also coupled by a second combinatorial circuit path to an input of a second storage cell in the circuit, preserve combinatorial cells on the first combinatorial circuit path and remove combinatorial cells on the second combinatorial circuit path;

4) for a particular circuit path coupled to an output of the circuit, which provides an input to storage element within the circuit, preserve the storage element within the circuit and combinatorial cells between the output and the storage element;

5) preserve clock, set, and reset circuit paths; and 6) preserve loading information about nets coupled to removed cells and preserved cells.

The invention can also be characterized as a machine which has a memory storing a timing shell netlist for a circuit made by executing the algorithm described above. Alternatively, the invention can be characterized as a method for generating such timing shell netlist based on recursively examining cells connected to nets at inputs and outputs of the circuit, and removing internal cells which meet the set of criteria described above. The timing shell netlist preserves information for timing analysis for a system which incorporates the circuit.

The process of examining the netlist for a circuit according to another aspect of the invention includes for a particular net at an input of the circuit examining each cell connected to the particular net and if the cell is a storage element, and the particular net carries a clock, set or reset signal, then saving a netname and loading information about the particular net. If the cell is not a storage element, then the cell is marked to keep and other cells coupled to the net are examined. Once all cells coupled to a particular net have been examined, then the algorithm proceeds with other inputs. If the cell is not a storage element, then the cell is marked to be kept and each cell on the net connected to the output of the kept cell is then examined. Then, other cells connected to the first net are examined if any remain, and then the algorithm proceeds with other inputs.

For a particular net at the output of the circuit, each cell is examined which is coupled to the particular net, and if the particular net is connected to an input of the cell, then netname and loading information about the particular net is saved, and the algorithm proceeds with other cells connected to the particular net if any, or proceeds to examine other outputs. If the particular net is connected to an output of the cell and the cell is a storage element, then the cell is marked to be kept. If the cell is not a storage element, then it is marked to be kept and each cell connected to the net on the inputs of the preserved cell are examined. Then, the algorithm proceeds with examining other cells connected to the particular net if any. If there are no other cells connected to the particular net connected to the output of the cell, then the algorithm proceeds with other outputs until all outputs have been reviewed.

Accordingly, the present invention provides a technique for simplifying and speeding up static timing analysis of hierarchical, complex ASIC designs. Further, it provides a mechanism for distributing information about core circuit designs to customers, without needlessly disclosing the interior workings of the core circuit designs. The technique developed is applicable to all hierarchical design methodologies independent of design styles. It results in the reduction of CPU time necessary for timing analysis along with reduction in memory requirements for systems executing such analysis. In addition, the reduced timing shell netlist is portable between different static timing analysis tools.

In sum, the present invention provides a practical solution for timing analysis of the next generation ASICs involving millions of logic gates. Other aspects and advantages of the present invention can be seen upon review of the figures, the detailed description, and the claims which follow.

DETAILED DESCRIPTION OF PREFERRED EMBODIMENTS

Figure 1:
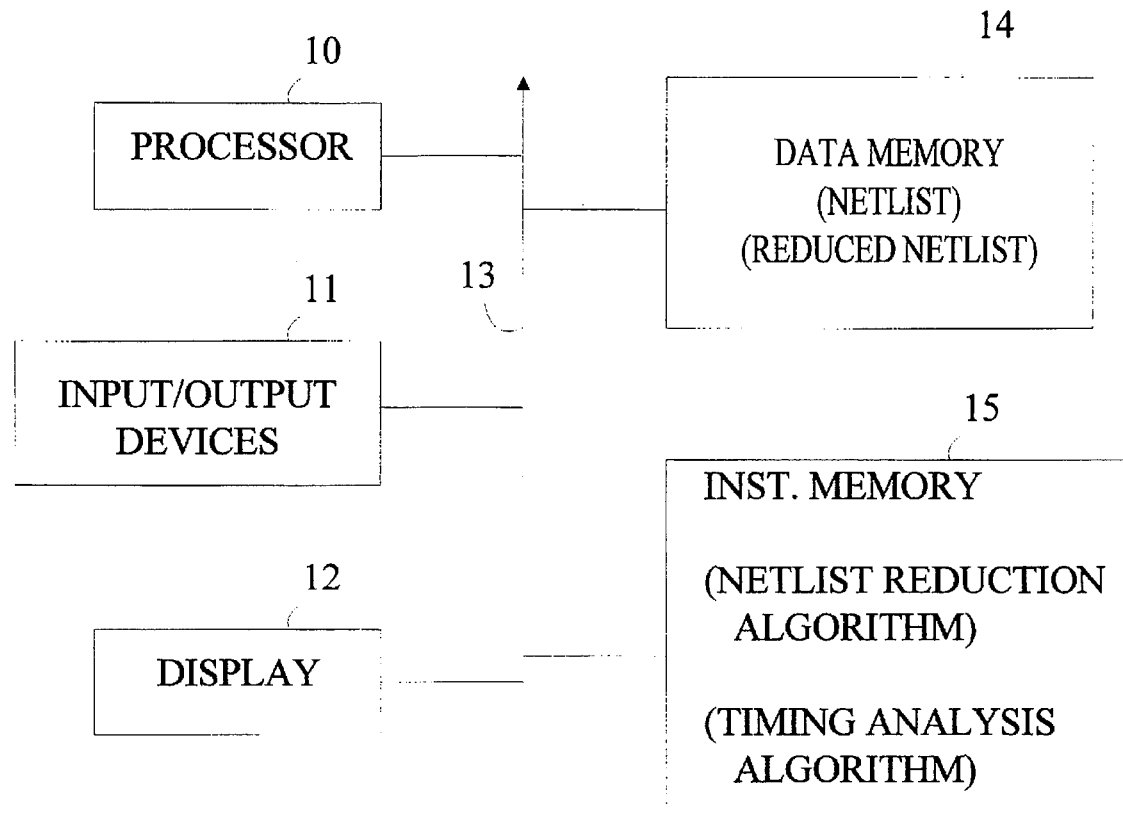
FIG. 1 is a block diagram of a system including processing resources for netlist list reduction and timing analysis according to the present invention.

A detailed description of preferred embodiments of the present invention is provided with reference to FIGS. 1 through 13, in which FIG. 1 provides a perspective of a machine used in generating a timing shell netlist according to the present invention. The machine shown in FIG. 1 includes a processor 10, input/output devices 11, and a display 12 coupled to a bus 13. Also coupled to the bus 13 are a data memory 14 and an instruction memory 15. This block diagram is meant to represent for instance commercial workstations or personal computers which basically include the elements shown.

According to the present invention, the data memory 14 stores a netlist and a reduced netlist produced. The instruction memory 15 stores a netlist reduction algorithm, and a timing algorithm used for design verification of ASICs as discussed above. Thus, the system described in FIG. 1 comprises resources for executing a netlist reduction algorithm which processes the netlist by removing internal cells that meet a set of criteria, and produces a timing shell netlist or a reduced netlist, which preserves information used in timing analysis of the system incorporating the circuit.

Figure 2:
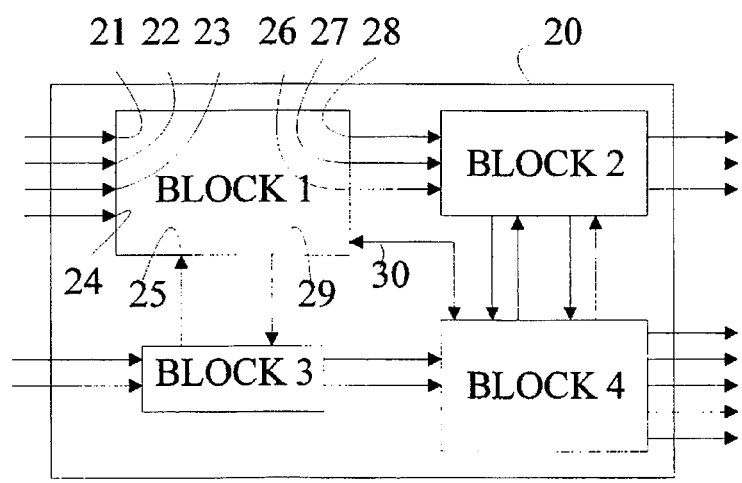
FIG. 2 is a diagram of a system incorporating a plurality of blocks which might be represented by timing shell netlists according to the present invention.

FIG. 2 conceptually illustrates an ASIC system 20 including a plurality of blocks: block 1, block 2, block 3, and block 4. Each of the blocks in the ASIC system 20 comprises a circuit represented by a netlist. The netlist defines the nets and cells within the block which make up circuit paths through the block. Each block has inputs, and outputs that interconnect the blocks with other blocks, or with the boundary of the system 20. The inputs and outputs (sometimes called "pins") of a particular block, for instance block 1, define the boundaries of the block. Thus, block 1 includes inputs 21 through 24 along the left side of the block, input 25 on the bottom of the block. Block 1 also includes outputs 26 through 28 along the right side of the block and output 29 on the bottom of the block. Further, an input and output port 30 is shown on the right side of the block.

According to the present invention, timing analysis of the system 20 is executed based on timing shell netlist of each of the blocks within the system. Thus, each of the blocks is represented by a boundary netlist at the upper level of the hierarchy. This boundary netlist, also referred to as a timing shell netlist, is used for delay prediction and timing verification of the system. Basically, the timing shell netlist is a netlist containing all the cells present on the paths from a primary input of the block to the first clocked element of the block, and the cells present on the paths from the last clocked element to the primary output. This timing shell netlist is generated by a "gate eater" that removes all the cells present on the internal synchronous paths. The timing shell reduces the run time and memory requirements during static timing verification.

According to one preferred embodiment of the present invention, following design rules should be observed for the blocks subject of the timing shells:

1) The design should be fully synchronous.

2) Timing analysis should examine set-up/hold times of storage elements such as flip-flops and latches. The set-up/hold time is constrained by the clock, set, reset and output signal loadings. In order to generate a robust timing shell, clock, set, reset, and output signals have to be isolated from external loadings. Thus, output paths from unbuffered flip-flops should be buffered. This is necessary to decouple the effect of loading outside the block boundary. For core cells within the block, clock/set/reset inputs have to be buffered internally to isolate the block's internal clock/set/reset from external loadings. For hierarchical design timing shell generation, the buffering of clock/set/reset signals can be avoided if the block's internal timing can tolerate all possible clock skews and ramp times existing in the design. Further, flip-flops in the block represented by timing shells should be as close as possible to the inputs and outputs of the block, in order to minimize the amount of logic to be retained in the shell.

3) Each core design should specify the input and output loading and ramp time ranges that will be acceptable to internal core timing constraints.

Using the approach of the present invention, once a block has been designed, timing verification must be accomplished at the block level. The verified netlist for the block is then used as a basis for a reduced timing shell netlist generation.

FIGS. 3 through 9 show examples of the elements of the netlist which need to be preserved in order to retain properties of the original block necessary for timing analysis. These diagrams show examples, but are not intended to address all possible circuit configurations.

The process described below with respect to FIGS. 12 and 13 processes circuit configurations including feedback, internal tristate cells, et cetera for netlist reduction according to these principles. The netlist reduction algorithm of the present invention efficiently decides to remove internal gates and generate a timing shell netlist that will retain boundary timing constraints of the original design.

The basic concept of the netlist reduction algorithm is to trace each input and output pin and recursively examine cells connected to each net at such pins. Based on the type of cell connected to the net, the netlist reduction algorithm decides whether the cell will be kept or removed. The approach ensures efficient netlist reduction and preserves all the necessary information for boundary timing constraint analysis.

Figure 3:
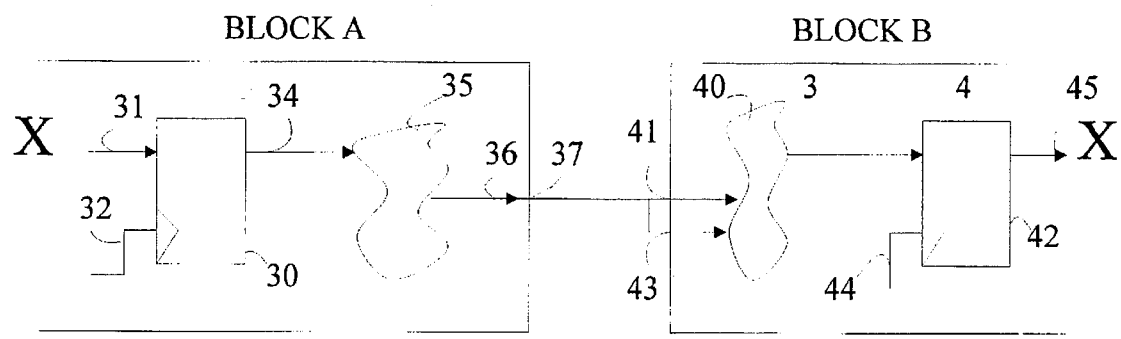
FIGS. 3 through 9 are schematic diagrams illustrating elements of a netlist which need to be preserved in order to retain information necessary for timing analysis.

FIG. 3 is used to illustrate the example in which combinatorial cells between the first or the last storage element and a block boundary must be preserved. Thus, as shown in FIG. 3 for block A, a storage element 30 has input 31 and clock 32. The output of the storage element 30 is provided on line 34 into a combinatorial path represented by cloud 35. The output of cloud 35 is provided on line 36 and crosses the boundary of the block at output 37. According to the present invention, the combinatorial cells in cloud 35 and the storage element 30 need to be preserved for the boundary shell netlist. Cells connected to the input of the storage element 30 need not be preserved under this criterion.

Also shown in FIG. 3 is a combinatorial circuit represented by cloud 40 which is between an input 41 and a storage element 42 in block B. This same combinatorial cloud 40 may also include an input 43 which may establish different modes of operation for the combinatorial cloud 40. As shown in the figure, the storage element 42 includes a clock input 44 and an output 45. According to the present invention, the combinatorial cells in the cloud 40 and the storage element 42 need to be preserved for the timing shell. Elements coupled to the output of the storage element 42 need not be preserved under this criterion.

Figure 4:
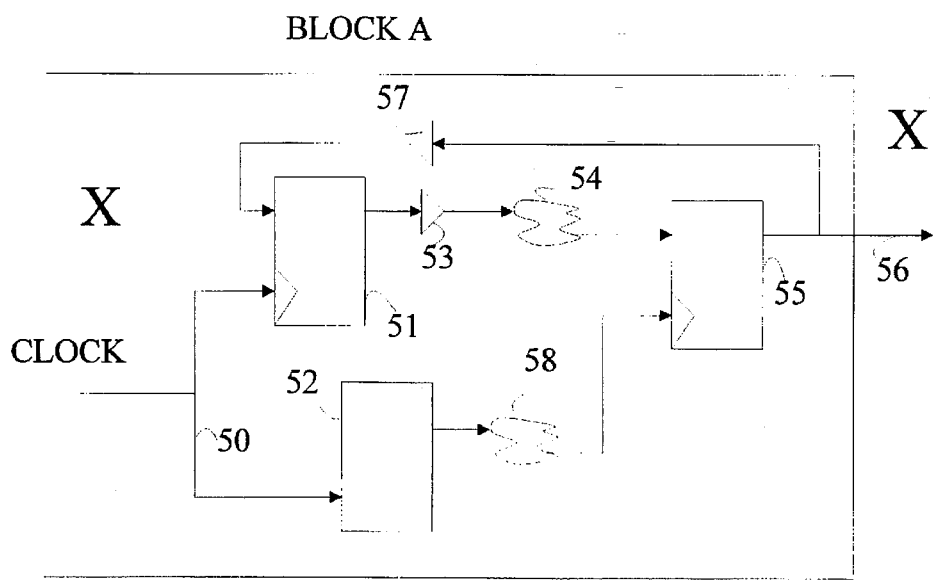

FIG. 4 illustrates the situation in which the primary output feedback and internal clock generation logic needs to be preserved. In FIG. 4, a clock signal is provided on line 50 which is used to clock a storage element 51 and a storage element 52. The output of storage element 51 is applied through a buffer 53 to a combinatorial cloud 54 which drives the data input of a storage element 55. The output of the storage element 55 is supplied as a primary output on line 56 and also fed back through buffer 57 as the data input to the storage element 51. The output of the storage element 52 is supplied through combinatorial cloud 58 as the clock input to storage element 55.

Because the primary output feedback from line 56 through buffer 57 affects the set up time of the storage element 51, this circuit path needs to be preserved. Thus, element 57 and element 51 are kept in the reduced netlist, in addition to element 55.

Also because elements 52 and 58 generate an internal clock for element 55, both element 52 and the combinatorial cloud 58 need to be preserved in the reduced netlist.

Figure 5:
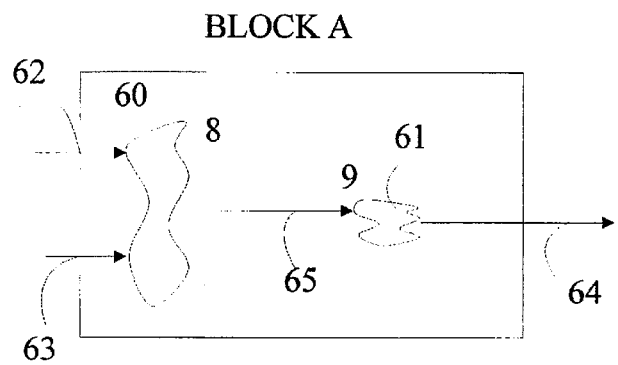

FIG. 5 illustrates the example in which direct combinatorial path occurs between boundaries of a block. Thus, in FIG. 5 block A includes a combinatorial cloud 60 and combinatorial cloud 61. Combinatorial cloud 60 is coupled to inputs 62 and 63 of the block. Combinatorial cloud 61 is coupled to the output 64 of the block. Clouds 60 and 61 are interconnected by a net 65 internal to the block. All the cells in clouds 8 and 9 need to be preserved. The timing arcs of direct combinatorial paths need to be preserved in the timing shell. This is due to the fact that static timing analysis has to consider the path and state dependencies, and timing tools perform analysis on paths between two flip-flops.

Figure 6:
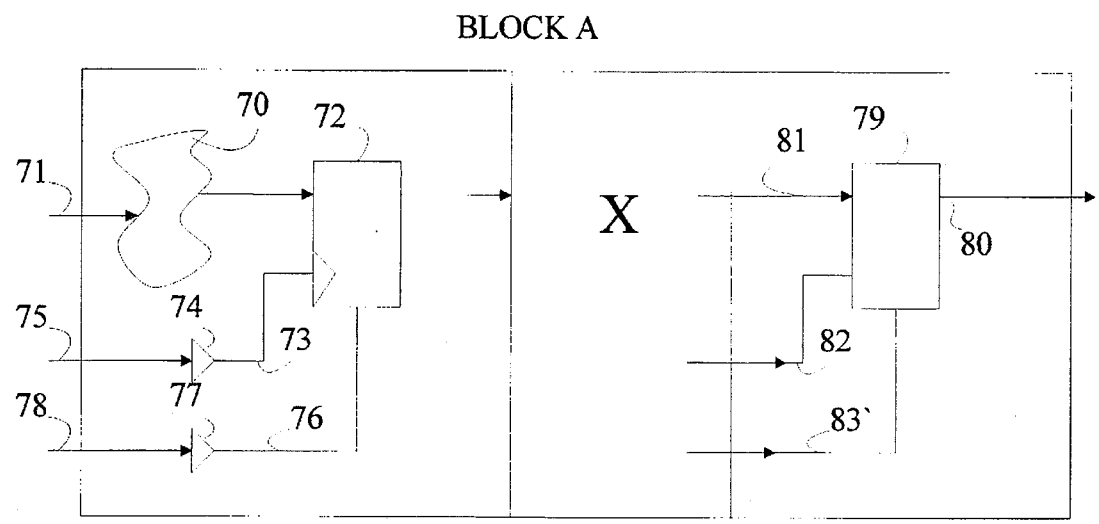

FIG. 6 illustrates the example in which all of the buffered input/outputs of clocks and asynchronous inputs to storage elements have to be preserved. Thus, block A shown in FIG. 6 includes a combinatorial cloud 70, which is coupled to input 71 of the block and to the input of storage element 72. The storage element 72 has a clock input on line 73 driven by a buffer 74. The buffer 74 is driven by input 75 of the block. Similarly, the flip-flop 72 includes a reset input on line 76 which is driven by buffer 77. Buffer 77 is driven by the input 78 of the block. Block A shown in FIG. 6 includes flip-flop 79 as well. The output of flip-flop 79 is connected to the output 80 of the block. Flip-flop 79 includes data input on line 81, a clock input on line 82, and a reset input on line 83. The algorithm needs to preserve accurate timing information concerning the signals on lines 73, 76, 82, and 83. Thus, loading information concerning these nets is preserved.

Figure 7:
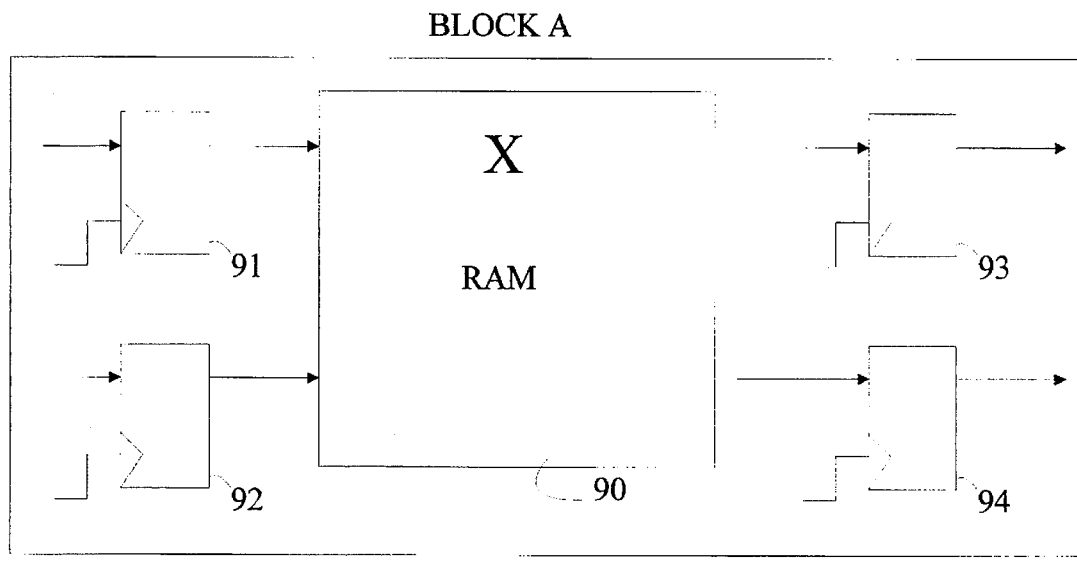

FIG. 7 illustrates the deletion of RAMs or other large memory elements which have inputs and outputs surrounded by registers. Thus, the block shown in FIG. 7 includes a large macro-cell RAM 90. All inputs of the RAM are driven by registers 91, 92. Similarly, all outputs of the RAM 90 drive registers 93, 94. Thus, the RAM need not be preserved. In case a memory mega cell such as the RAM 90 has direct connection in or out of the block, then the entire memory mega cell needs to be preserved for the timing shell netlist.

Figure 8:
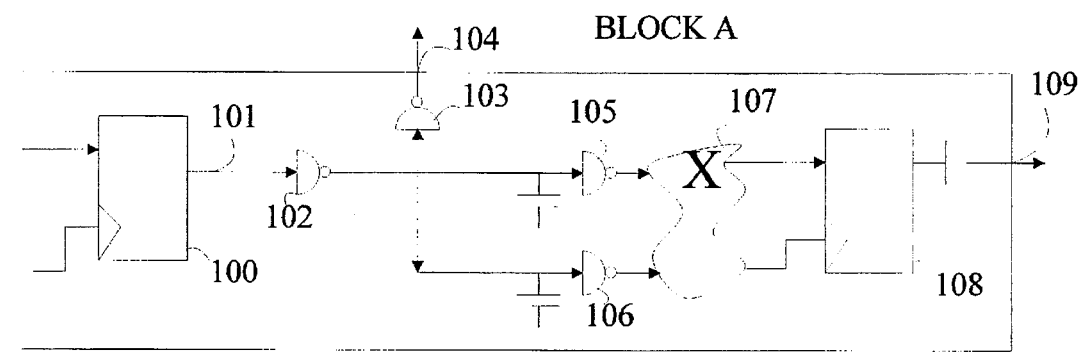

FIG. 8 describes a special case. In FIG. 8, the block A has an internal register 100 which has output 101 connected to a gate 102. The output of the gate 102 is connected through gate 103 to a block boundary output 104. Also, the output of gate 102 is connected to internal gates 105, 106 which drive a combinatorial cloud 107. The output of the combinatorial cloud 107 is connected to a register 108 which is clocked by another signal produced in the cloud 107. The output of the register 108 drives an output pin 109 of the block.

Thus, FIG. 8 illustrates the case in which an output of an internal flip-flop 100, which is not the first or last stage flip-flop in the block, connects across a block boundary through a gate, such as gates 102 and 103. In such case, gates 102 and 103 and register 100 need to be preserved. Gates 105 and 106 should be deleted. However, the loading on the input net driving gate 103 needs to be preserved.

Figure 9:
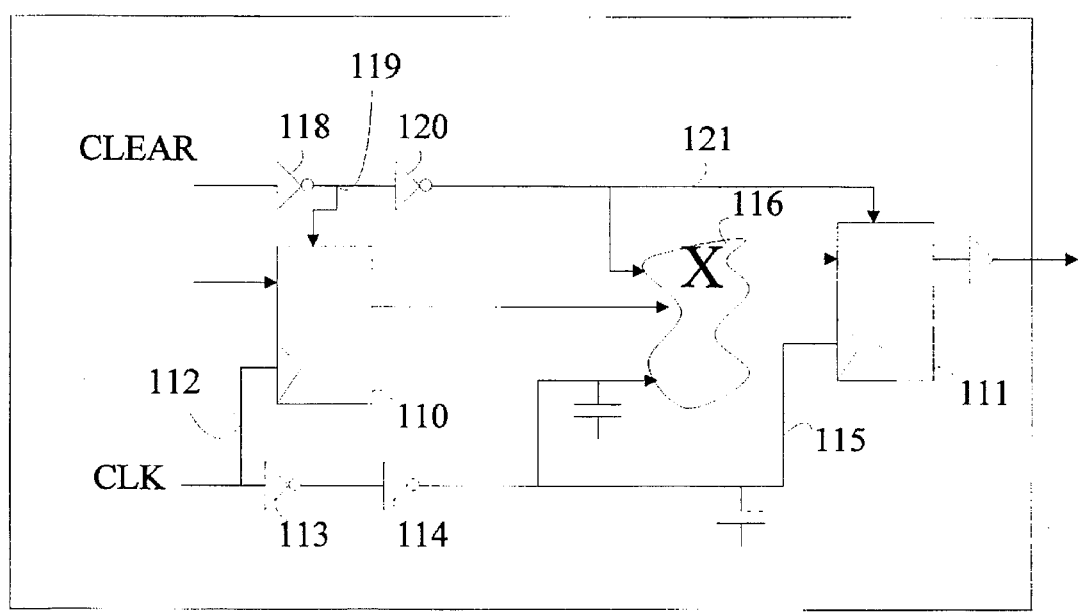

FIG. 9 illustrates the treatment of clock/set/reset structures. Thus, the block A in FIG. 9 includes a register 110 and a register 111. Register 110 is driven by the clock signal on trace 112. The clock signal on trace 112 is supplied through inverters 113 and 114 as the clock signal on register 111. Also, the output of inverter 114 on line 115 is coupled as an input to combinatorial cloud 116. Similarly, a reset signal on trace 117 is supplied through inverter 118 to line 119 which is used as a reset for the register 110. Line 119 is connected to the input of inverter 120 which drives line 121. Line 121 is connected to a combinatorial cloud 116, and has the reset input signal for register 111. According to the present invention, the clock distribution buffers and reset/set distribution structures should be kept. Thus, the inverters on 113, 114, 118, and 120 need to be preserved. Also, the effective loadings on the clock/set/reset nets, such as net 115, net 121, net 119, and net 112 need to be stored with the new gate-eaten netlist.

Figure 10:
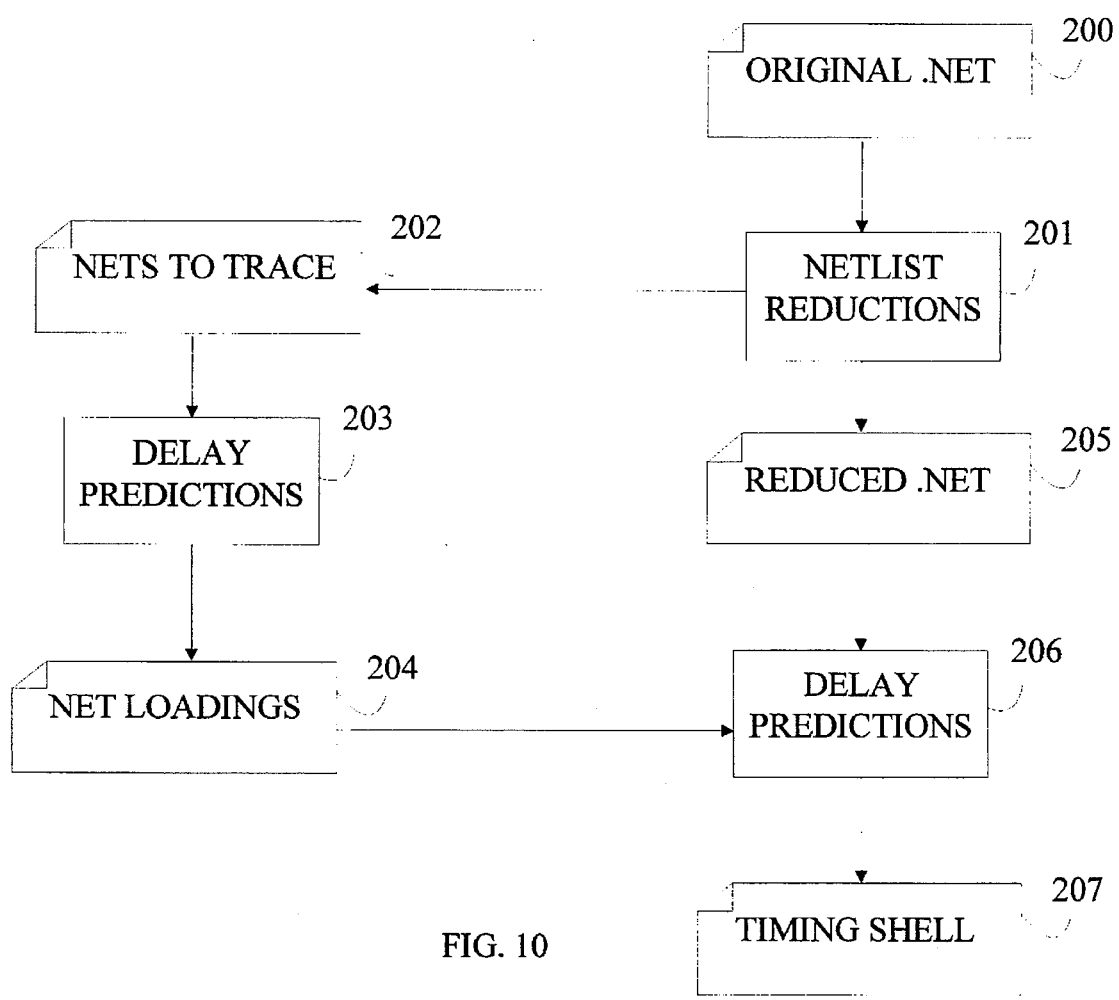
FIG. 10 is a flow diagram for a timing shell analysis according to the present invention.

Accordingly, the algorithm for timing shell generation and analysis according to the present invention is represented as shown in FIG. 10. The algorithm begins with an original netlist (.net) file which specifies a netlist of a circuit block (block 200). Next, the netlist reduction algorithm is executed (block 201). The netlist reduction algorithm in block 201 stores nets which need to have loading information preserved as indicated at block 202. Original net information from block 200 is combined with the net information from block 202 and a delay prediction tool is executed to analyze the nets identified (block 203). The result is the loadings on the specified nets which are stored in a file (block 204).

Also the netlist reduction algorithm 201 generates a reduced netlist (.net) file (block 205). This file is applied in combination with the net loading from block 204 to a delay prediction tool (block 206) which combines the resulting information into a new timing shell for the block (block 207).

The net loadings provide the effective capacitance on the clock/set/reset nets in the original netlist so that it can be applied to the clock/set/reset nets in the new reduced netlist by the tool in block 206. The loadings need to be preserved because deleted flip-flops may have an effect on the timing of these nets.

Thus, an optional tool can be provided for an analysis product providing timing shell generation capability. The option can be characterized by the basic synopsis of "tshellgen" set out in Appendix 1.

Figure 11:
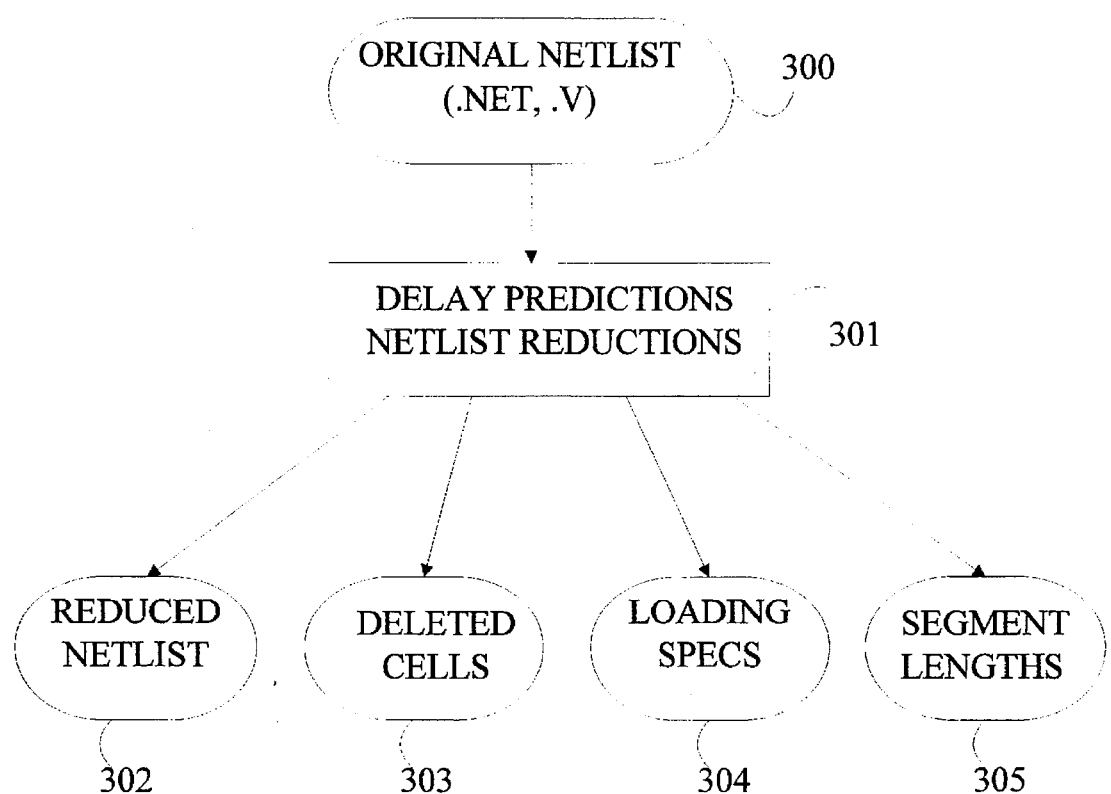
FIG. 11 illustrates results of timing shell generation according to one embodiment of the present invention.

The tshellgen program generates a new timing shell netlist ".tnet or .tv" file from the gate level netlist. Along with the new timing shell netlist, it generates a .tdelcel and .tspec files, with the module name as a prefix. Thus, the option can be schematically characterized as shown in FIG. 11. The original netlist is characterized by block 300. The delay prediction process and netlist reduction process execute in response to the original netlist (block 301) and generate a reduced netlist (.tnet or .tv) file (block 302), the deleted cell (.tdelcel) file (block 303), the loading specifications (.tspec) file (block 304), and the wire segment length (.tseglen) file (block 305). The reduced netlist .tnet file or .tv file 302 provides a timing shell list of preserved cells. The .tdelcel file 303 identifies those cells which have been deleted from the original netlist 300. The .tspec file 304 contains preserved net loading information for clocks, sets, resets, interface output, et cetera. The .tseglen file 305 contains wire segment length information for the gate-eaten block.

Figure 12:
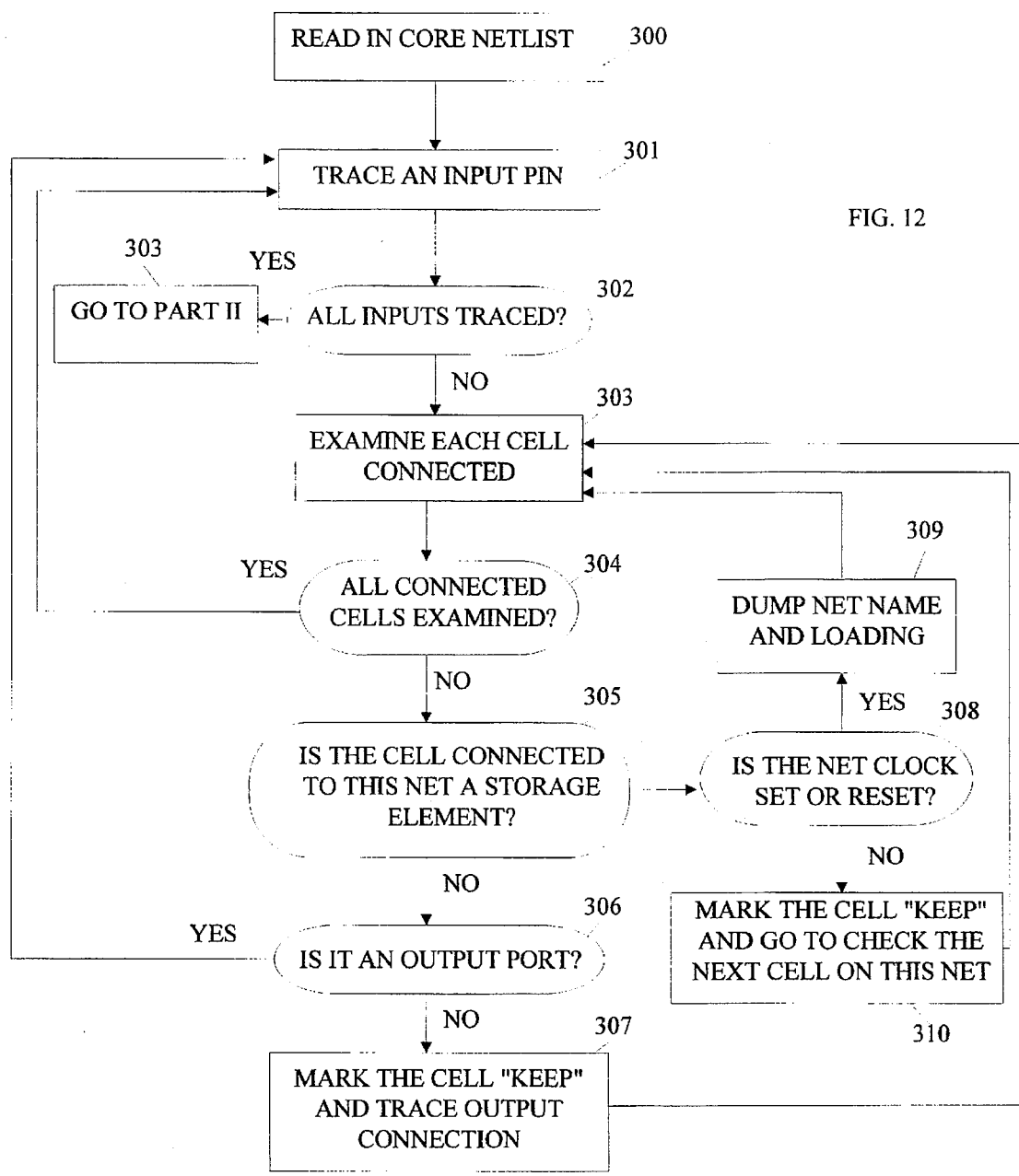
FIG. 12 is a flow chart for input pin tracing in the netlist reduction algorithm of the present invention.
Figure 13:
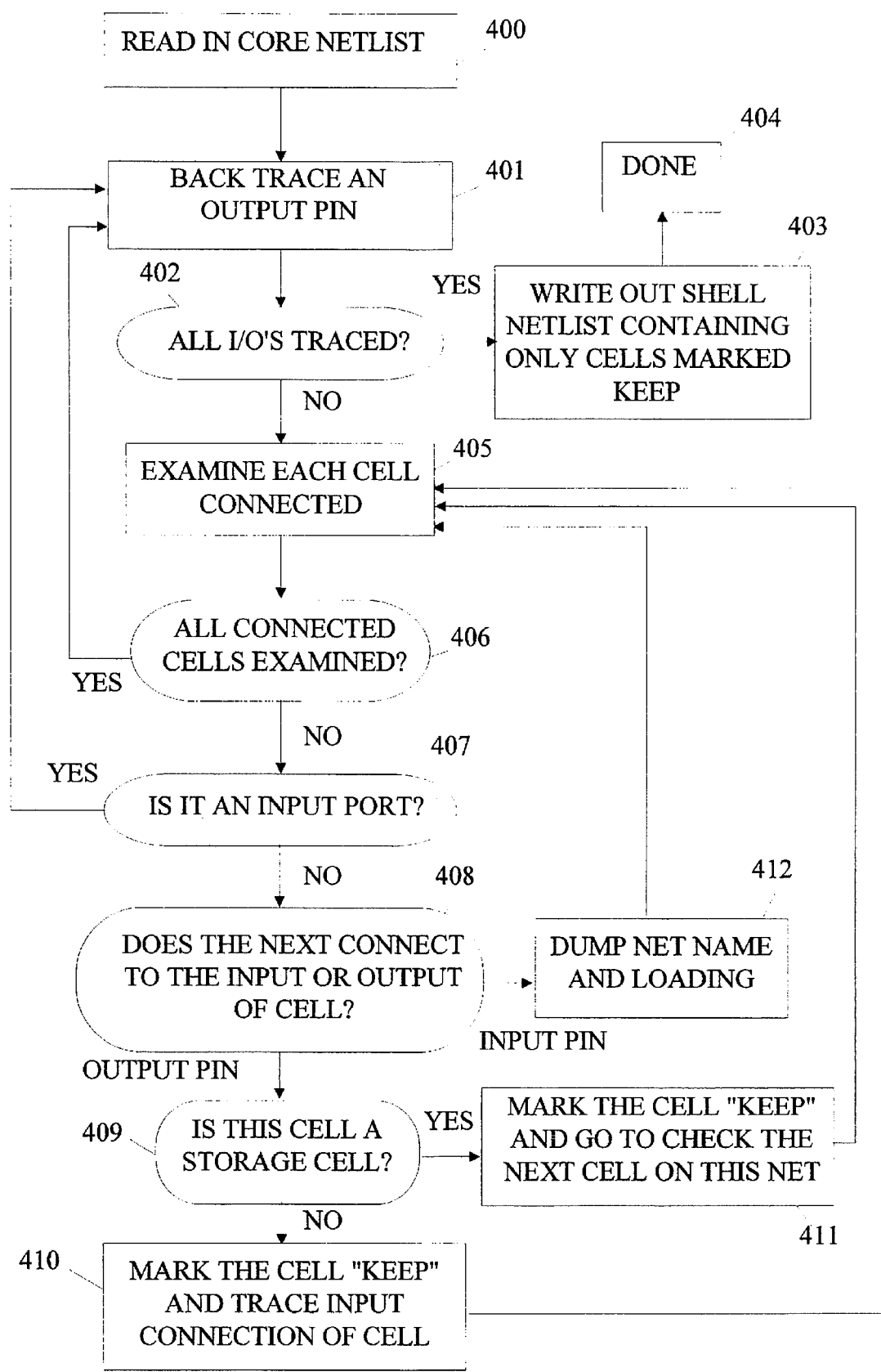
FIG. 13 is a flow chart for output pin tracing for the netlist reduction algorithm according to the present invention.

The netlist reduction algorithm according to the present invention can be represented by the flow charts shown in FIGS. 12 and 13. FIG. 12 illustrates the first part of the algorithm which involves input pin tracing. The algorithm begins by reading the core netlist (block 300). For each input pin, the algorithm traces the net coupled with the input pin (block 301). Next the algorithm determines whether all inputs have been traced (block 302). If they have all been traced, then it branches to the second part of the algorithm shown in FIG. 12 which traces output pins (block 303). If all inputs have not yet been traced, then the algorithm branches to block 303 where it examines each cell connected to the current net. Thus, the algorithm first determines whether all connected cells have been examined (block 304). If not, then the algorithm determines whether the cell connected to the current net is a storage element (block 305). If it is not a storage element, then the algorithm determines whether the net is coupled to an output port of the cell (block 306). If it is not an output port, then the cell is marked "keep" and the algorithm proceeds to trace nets connected to outputs of the preserved cell (block 307). Thus, block 307 incorporates an algorithm such as that shown starting with block 303 for the preserved combinatorial cell. When finished, the algorithm branches back to block 303 to continue tracing examining cells connected to the net at the input.

If at block 305 it is determined that the cell is a storage element, then the algorithm determines whether the net is connected to the clock, set, or reset input on the storage element (block 308). If it is, then the netname and loading are dumped to the .tspec file as described above (block 309). If it is not, then the cell is marked "keep", and the algorithm proceeds to check the next cell on the net (block 310) by branching back to block 303.

If at block 304 it is determined that all cells had been examined for the particular net, then the algorithm branches back to block 301 to continue tracing input pins. If at block 304 it is determined that the net was connected to an output port of a combinatorial cell, then the algorithm reverts back to block 301 without keeping the cell.

Part 2 of the algorithm is shown in FIG. 13. FIG. 13 also begins by reading the core netlist (block 400). Next, the algorithm backtraces the net coupled to each output pin of the block (block 401). Thus, next the algorithm determines whether all input/output pins have been traced (block 402). If they have, then the shell netlist is written out containing only cells marked "keep" (block 403) and the algorithm is done (block 404). If not all pins have been traced, then the algorithm proceeds to block 405 where each cell connected to the particular net is examined. Thus, the algorithm determines whether all connected cells have been examined yet (block 406). If they have, then the algorithm moves back to block 401 to trace another pin. If not, then the algorithm determines whether the net is connected to an input port of the circuit block (block 407). If it is, then the algorithm again loops back to trace another output pin (block 401). If not, then the algorithm determines whether the net connects to an input or output of a cell (block 408).

If the net is connected to the output pin of a cell, then the algorithm determines whether the cell is a storage element (block 409). If it is not a stored element, then the cell is marked "keep" and the input pin connection for the cell is traced (block 410). If the cell is a storage element, then the algorithm marks the cell "keep" (block 411), and proceeds to block 405 to examine the next cell on the net.

If at block 408 it is determined that the trace which is not a primary output is coupled to the input pin of a cell, then the netname and loading are dumped to the .tspec file (block 412), and the algorithm loops back to block 405 to examine other cells connected to the net.

Applying the algorithm described above with reference to FIGS. 12 and 13, a netlist in a standard NDL format such as shown in Appendix 2 is reduced to a timing shell netlist as shown in Appendix 3. These excerpts illustrate a simplified example. It will be appreciated that netlists involving large numbers of cells may be reduced according to the present invention.

According to the hierarchical design flow after constraints are met at a sub block level, a gate level netlist is obtained. After verification of timings for the block using a timing shell generator, this netlist is converted into a shell containing block boundary information. The function of the shell generator is to delete internal cells meeting a set of criteria described above, by following the algorithms of FIGS. 12 and 13. The result is a shell netlist that can reproduce boundary timing constraints. The timing shell netlist can be generated according to standard NDL or VERILOG formats, or other equivalent netlist formats.

The invention results in a data structure, referred to as a timing shell netlist in the application, which can be stored into memory and used in timing analysis of systems being designed, such as very complex integrated circuits incorporating millions of logic gates. The present invention makes timing analysis more efficient, by reducing memory requirements and processor time needed for this analysis for complex circuits. Further, the data structure resulting can be commercially distributed without disclosing information which would be kept confidential by a designer of an integrated circuit cell block.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

---

APPENDIX 1
Copyright LSI Logic, 1995

Synopsis
tshellgen [-clock <clock_name>] [-tdelcel <tdelcel file>] [-tspec <tspec file>]
    [-output <tnet/.tv file>] [-seglen <LSITKseglen file>] -technology
    <lcaxxx/1cbxxx/leaxxx>
        -nets <list of netlist file names> -top_module <top_module_name>
        -language <language> -die <die_code>
    [-primary <primary_voltage>] [-secondary <secondary_voltage>]
    [-layers <routing_layers>] [-chipx <chip_size_x>]
    [-chipy <chip_size_y>] [-separator <string_of_separators>]
    [-name_map <name_map_file>] [-verilog] [-motive]
    [-cases "<list_of_cases>"] [-delspec <user_option_file>] [-rev]
    [-help] [-version] [-error_table]
    [-tspec <user_option_file]
Where:
[-clock <clock_name>] a string specifies name of clock input
[-tdelcel <tdelcel file>] a string specifies prefix of the .tdelcel file that contains information about cells deleted during timing shell generation.
[-tspec <tspec file>] a string specifies prefix of the .tspec file that contains effective loading information for clock/set/reset nets.
[-output <tnet/.tv file>] a string specifies prefix of the new timing shell netlist .tnet/.tv file.
[-seglen <LSITKseglen file>] a string specifies the prefix of the merged .LSITKseglen file.
-technology <lcaxxx/1cbxxx/leaxxx> a string specifies LSI technology for the design
-nets<list of netlist file names> a space separated netlist file names
-top_module <top_module_name> a string specifies top module name of the design
-language <language> a string specifies language of the netlist files
-die <die_code> a string specifies die code of the design
[-primary <primary_voltage>] a real number specifies primary voltage
[-secondary <secondary_voltage>] a real number specifies secondary voltage
[-layers <routing_layers>] an integer number specifies number of routing layers
[-chipx <chip_size_x>] a real number specifies x dimension of the chip
[-chipy <chip_size_y>] a real number specifies y dimension of the chip
[-separator <string_of_separators>] a string specifies list of bus separators
[-name_map <name_map_file>] a string containing the prefix of the name map file
[-verilog] options specifies generation of verilog SDF
[-motive] options specifies generation of motive SDF
[-cases "<list_of_cases>"] a string specifies the delay cases
[-delspec <user_option_file>] a string specifies the user option delspec file name
[-tspec <user_option_file] a string specifies a file which contains net loading to be restored during delay prediction using timing shell

---

APPENDIX 2
Copyright LSI Logic, 1995 compile ;
module blk7 ;
inputs
    clk7 , f7in ;
outputs
    bo , so ;
level function ;
define
/* Parts */
    1clkbuf1_1(x#–12#1#=z)

APPENDIX 2
Copyright LSI Logic, 1995

```
        =1clkbuf1(x#-27#0#=a) ;
    fd1__1 (x#-4#6#=q)
        =fd1(x#-12#1#=cp,x#-15#6#=d) ;
    or2__1(x#50#6#=z)
        =or2(x#41#12#=b,x#27#21#=a) ;
    fd1__2(x#64#6#=q)
        =fd1(x#-12#1#=cp,x#50#6#=d) ;
    nd2__4(x#27#21#=z)
        =nd2(x#9#33#=a,x#9#33#=b) ;
    nd2__2(x#43#32#=z)
        =nd2(x#9#33#=a,x#9#33#=b) ;
    eo__1(x#41#12#=z)
        =eo(x#27#21#=a,x#28#6#=b) ;
    nd2__3(x#28#6#=z)
        =nd2(x#9#33#=a,x#9#33#=b) ;
    nd2__1(x#9#33=z)
        =nd2(x#-4#6#=a,x#-4#6#=b) ;
/* Extractors */
/* Nets */
    x#-15#6#=(f7in) ;
    x#-27#0=(clk7) ;
    x#64#6#=(bo) ;
    x#43#32#=(so) ;
annotations
{
    bus bus_type ="dot" ;
}
end module ;
end compile ;
end ;
```

APPENDIX 3
Copyright LSI Logic, 1995

```
compile ;
module blk7 ;
inputs
    clk7,f7in ;
outputs
    bo,so ;
level function ;
define
/* Parts */
    1clkbuf1__1(x#-12#1#=z)
        =1clkbuf1(x#-27#0#=a) ;
    fd1L_1(x#-4#6#=q)
        =fd1(x#-12#1#=cp,x#-15#6#=d) ;
    fd1__2(x#64#6#=q)
        =fdl(x#-12#1#=cp, x#50#6#=d) ;
    nd2__2(x#43#32#=z)
        =nd2(x#9#33#=a,x#9#33#=b) ;
    nd2__1(x#9#33#=z)
        =nd2(x#-4#6#=a,x#-4#6#=b) ;
/* Extractors */
/* Nets */
    x#-15#6#=(f7in) ;
    x#-27#0#=(clk7) ;
    x#64#6#=(bo) ;
    x#43#32#=(so) ;
annotations
{
    bust bus_type ="dot" ;
}
end module ;
end compile ;
end ;
```

We claim:

1. An apparatus for reducing a netlist which defines circuit paths and cells in a first circuit to provide a timing shell having the same timing constraints as said netlist, the timing shell netlist representing a second circuit, said apparatus comprising:

a memory for storing the netlist; and a processor connected to the memory for executing a program, to reduce the netlist to the timing shell netlist by removing entries in the netlist that correspond to cells that are internal to the first circuit, the removed entries being chosen such that the second circuit has the same inputs and outputs as the first circuit and the same timing constraints with respect to signals entering and leaving the inputs and outputs, respectively, and the second circuit having a different circuit functionality than said first circuit.

2. The apparatus of claim 1, wherein the processor recursively examine cells in the netlist along circuit paths connected to nets at each input and output of the circuit.

3. The apparatus of claim 1, wherein for a particular circuit path connected to a net at an input of the circuit, the processor preserves netlist entries corresponding to combinatorial cells between the input and a first storage element on the particular circuit path.

4. The apparatus of claim 3, wherein the processor preserves netlist entries corresponding to combinatorial cells coupled to a combinatorial path between the particular circuit path and a circuit boundary without an intervening storage cell.

5. The apparatus of claim 1, wherein for a particular circuit path coupled to an input and an output of the circuit, the processor preserves netlist entries corresponding to combinatorial cells on the particular circuit path which establish a combinatorial path between the input and the output.

6. The apparatus of claim 1, wherein for a particular net coupled by a first combinatorial circuit path from an output of a first storage cell in the circuit to a circuit boundary, in which the first storage cell is also coupled by a second combinatorial circuit path to an input of a second storage cell in the circuit, the processor preserves netlist entries corresponding to combinatorial cells on the first combinatorial circuit path and removes netlist entries corresponding to combinatorial cells on the second combinatorial circuit path.

7. The apparatus of claim 1, wherein the processor preserves clock, set and reset circuit paths within the netlist.

8. The apparatus of claim 1, wherein the processor preserves loading information about removed cells coupled to nets between preserved cells.

9. The machine of claim 1, wherein for a particular circuit path connected to a net at an input of the first circuit, the processor preserves netlist entries corresponding to combinatorial cells between the input and a first storage element on that particular circuit path and combinatorial cells coupled to a combinatorial path between that particular circuit path and a circuit boundary without an intervening storage cell;

for a particular circuit path coupled to an input and an output of the first circuit, the processor preserves netlist entries corresponding to combinatorial cells on that particular circuit path which establish a combinatorial path between the input and the output;

for a particular net coupled by a first combinatorial circuit path from an output of a first storage cell in the first circuit to a circuit boundary, in which the first storage cell is also coupled by a second combinatorial circuit path to an input of a second storage cell in the first circuit, the processor preserves netlist entries corresponding to combinatorial cells on the first combinatorial circuit path and remove combinatorial cells on the second combinatorial circuit path, and wherein the processor also preserves clock, set and reset circuit paths, loading information about nets coupled to removed cells and netlist entries corresponding to cells that must be preserved as determined by other criteria.

10. A method for operating a computing system to generate a timing shell netlist for a first circuit from a netlist which defines circuit paths and cell in the circuit, said timing shell netlist representing a second circuit, the method comprising the steps of recursively examining cells connected to nets at inputs and outputs of the circuit and removing internal cells meeting a set of criteria while preserving in the timing shell netlist information for timing analysis of a system incorporating the circuit, the second circuit having a different circuit functionality than the first circuit.

11. The method of claim 10 wherein the set of criteria includes:

for a particular circuit path connected to a net at an input of the first circuit, preserve combinatorial cells between the input and a first storage element on the particular circuit path and preserve combinatorial cells coupled to a combinatorial path between the particular circuit path and a circuit boundary without an intervening storage cell;

for a particular circuit path coupled to an input and an output of the first circuit, preserve combinatorial cells on the particular circuit path which establish a combinatorial path between the input and the output;

for a particular net coupled by a first combinatorial circuit path from an output of a first storage cell in the first circuit to a circuit boundary, in which the first storage cell is also coupled by a second combinatorial circuit path to an input of a second storage cell in the first circuit, preserve combinatorial cells on the first combinatorial circuit path and remove combinatorial cells on the second combinatorial circuit path;

preserve clock, set and reset circuit paths of the first circuit; and preserve loading information about nets coupled to removed cells and preserved cells of the first circuit.

12. The method of claim 10, wherein the step of examining includes:

for a particular net at an input of the first circuit, examining each cell connected to the particular net, and if the cell is a storage element, and the particular net carries a clock, set or reset signal, save a netname and loading information about the particular net, else preserve the cell and proceed with other cells connected to the particular net if any, then proceed with other inputs;

if the cell is not a storage element, preserve the cell and examine each cell on each net connected to an output of the preserved cell, then proceed with other cells connected to the particular net if any, then proceed with other inputs; and for a particular net at an output of the first circuit, examine each cell connected to the particular net, and if the particular net is connected to an input of the cell, then preserve a netname and loading information about the particular net, then proceed with other cells connected to the particular net if any, then proceed with other outputs;

if the particular net is connected to an output of the cell and the cell is a storage element, then preserve the cell, else preserve the cell and examine each cell on each net connected to an input of the preserved cell, then proceed with other cells connected to the particular net if any, then proceed with other outputs.

\* \* \* \* \*